United States Patent
Tanaka et al.

(10) Patent No.: US 7,317,218 B2
(45) Date of Patent: Jan. 8, 2008

(54) SOLID-STATE IMAGING DEVICE HAVING A PUNCH-THROUGH STOPPER REGION POSITIONED CLOSER TO A SIGNAL ACCUMULATION REGION THAN IS AN END OF THE DRAIN REGION

(75) Inventors: Syouji Tanaka, Ikoma (JP); Ryohei Miyagawa, Mukou (JP); Kazunari Koga, Takatsuki (JP); Tatsuya Hirata, Ibaraki (JP); Hiroki Nagasaki, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 38 days.

(21) Appl. No.: 11/263,973

(22) Filed: Nov. 2, 2005

(65) Prior Publication Data

US 2006/0157756 A1    Jul. 20, 2006

(30) Foreign Application Priority Data

Jan. 17, 2005   (JP)   ............................. 2005-009678

(51) Int. Cl.
*H01L 31/062*   (2006.01)

(52) U.S. Cl. ............... 257/292; 257/293; 257/E27.133; 257/E25.032

(58) Field of Classification Search ..................... None
See application file for complete search history.

(56) References Cited

U.S. PATENT DOCUMENTS

2002/0001039 A1*   1/2002   Ishiwata ..................... 348/308

FOREIGN PATENT DOCUMENTS

JP   2000-150847   5/2000

\* cited by examiner

*Primary Examiner*—Evan Pert
*Assistant Examiner*—Tan Tran
(74) *Attorney, Agent, or Firm*—Wenderoth, Lind & Ponack, L.L.P.

(57) ABSTRACT

A solid-state imaging device can increase the amount of signal charge accumulation in a photodiode. The solid-state imaging device includes a gate electrode formed on a p-type semiconductor substrate. An n-type signal accumulation region accumulates the signal charge obtained through a photo-electrical conversion, and is formed in the semiconductor substrate so that a portion of the signal accumulation region is positioned below the gate electrode. An n-type drain region is positioned in the semiconductor substrate so that the n-type drain region is positioned opposite the signal accumulation region across the gate electrode. A p-type punch-through stopper region has a higher impurity concentration than the semiconductor substrate, and is formed in the semiconductor substrate so that the p-type punch-through region is positioned below the drain region, wherein an end of the punch-through stopper region is positioned closer to the signal accumulation region than the end of the drain region.

10 Claims, 8 Drawing Sheets

SOLID-STATE IMAGING DEVICE HAVING A PUNCH-THROUGH STOPPER REGION POSITIONED CLOSER TO A SIGNAL ACCUMULATION REGION THAN IS AN END OF THE DRAIN REGION

BACKGROUND OF THE INVENTION (1) Field of the Invention

The present invention relates to a solid-state imaging device, and in particular to a solid-state imaging device having an improved read-out transistor portion which reads out signal charge from a photodiode, and to a manufacturing method thereof.

(2) Description of the Related Art

Conventionally, solid-state imaging devices such as a Charge-Coupled Device (CCD) solid-state imaging device and a metal-oxide semiconductor (MOS) solid-state imaging device are used for various image input apparatuses such as video cameras, digital still cameras and facsimiles. The solid-state imaging devices are mainly used for portable apparatuses and low-voltage drive is required for the solid-state imaging devices. A solid-state imaging device responding to this requirement is disclosed, for example, in Japanese Laid-Open Patent Application No. 2000-150847.

Figure 1:
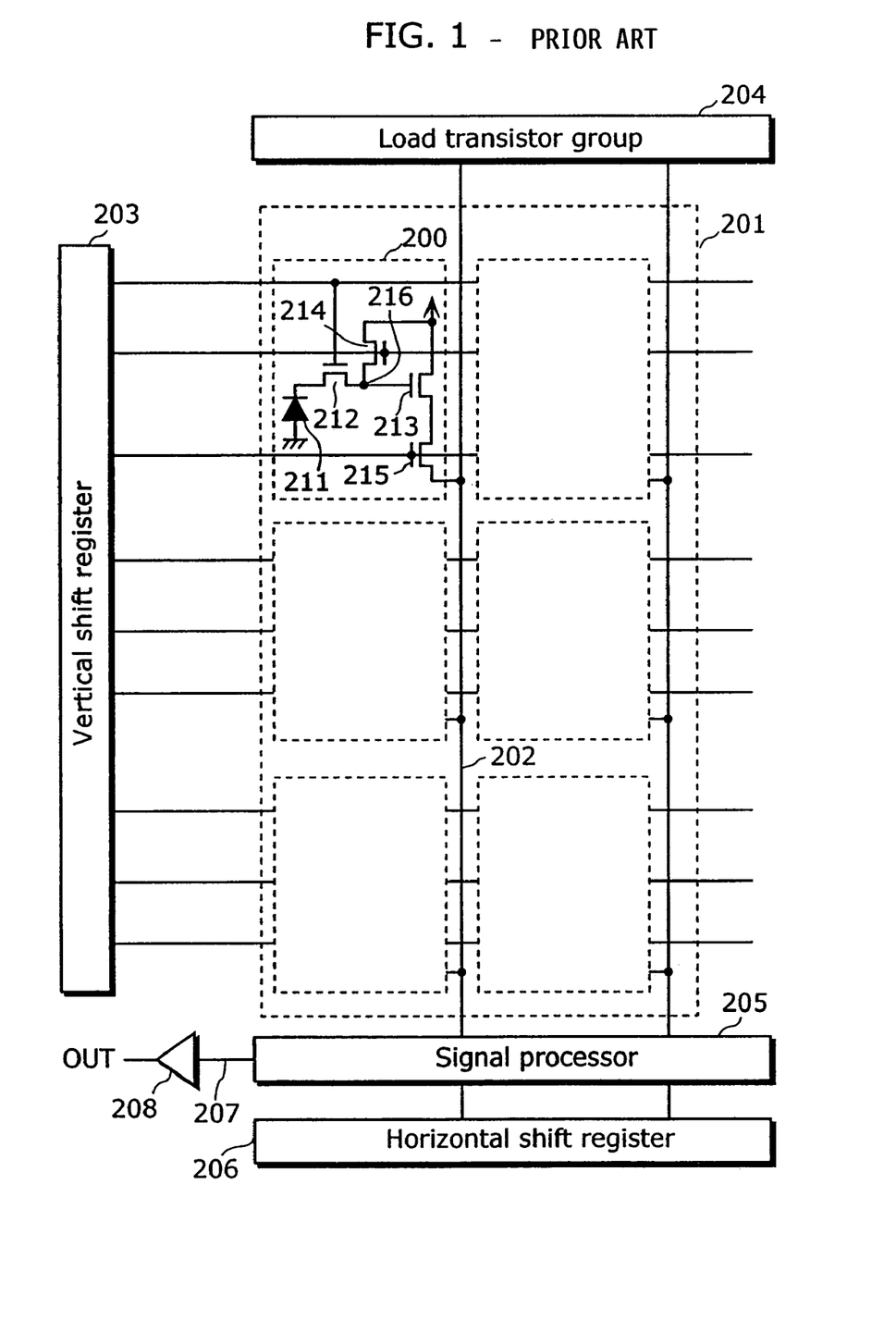
FIG. 1 is a circuit diagram showing a structure of a conventional MOS-type solid-state imaging device.

FIG. 1 is a circuit diagram showing a structure of a conventional MOS-type solid-state imaging device.

The solid-state imaging device includes an image area 201 in which n×m unit cells 200 are arranged in a two-dimensional array, a first vertical signal line 202 for transmitting signal voltages of the unit cells 200 on a column-by-column basis to a signal processor 205, a vertical shift register 203 which selects the unit cells 200 on a row-by-row basis, a load transistor group 204, and the signal processor 205 which holds the signal voltages transmitted through the first vertical signal line 202 and cuts noise, a horizontal shift register 206 which selects the unit cells 200 on a column-by-column basis, a horizontal signal line 207 for transmitting the signal voltage outputted from the signal processor 205 to an output amplifier 208, and the output amplifier 208.

Each of the unit cells 200 is made up of a photodiode 211 which converts an optical signal into signal charge, a read-out transistor 212 which reads out the signal from the photodiode 211, an amplifying transistor 213 which amplifies signal voltage of the photodiode 211, a reset transistor 214 which resets the signal voltage of the photodiode 211, a vertical selecting transistor 215 which selects a row from which the amplified signal voltage is to be read out, and a floating diffusion (FD) unit 216 which detects the signal voltage of the photodiode 211.

Figure 2:
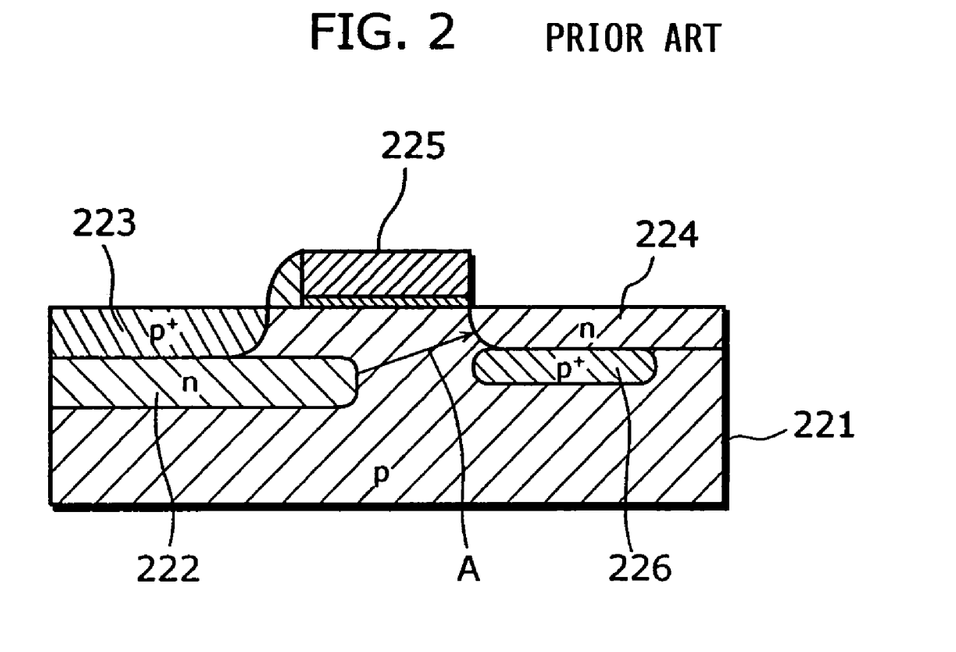
FIG. 2 is a cross-sectional diagram showing a structure of a unit cell of the conventional MOS-type solid-state imaging device (a cross-section in the vicinity of a read-out transistor)

FIG. 2 is a cross-sectional diagram showing a structure of the unit cell 200 (a cross-section in the vicinity of the read-out transistor 212).

The unit cell 200 includes an n-type signal accumulation region 222, a p-type surface shielding region 223, an n-type drain region 224 and a p-type punch-through stopper region 226 that are formed in a p-type semiconductor substrate 221. A gate electrode 225 of the read-out transistor 212 is also formed on the semiconductor substrate 221.

The signal accumulation region 222 operates as the photodiode 211 and accumulates the signal charge that is obtained through a photo-electrical conversion.

The surface shielding region 223 is positioned in a surface of the semiconductor substrate 221 and next to the gate electrode 225, and prevents the accumulation of noise charge in the signal accumulation region 222 by shielding the noise charge generated in the surface of the semiconductor substrate 221.

The drain region 224 is positioned opposite the surface shielding region 223 across the gate electrode 225 in the surface of the semiconductor substrate 221, and operates as the FD unit 216.

The punch-through stopper region 226 is positioned closer to a rear surface of the semiconductor substrate 221 than the drain region 224, and prevents the punch-through, in other words, prevents the signal charge accumulated in the signal accumulation region 222 from being read out to the drain region 224 without a control by the gate electrode 225.

Here, the surface shielding region 223 and the punch-through stopper region 226 have an impurity concentration that is one-digit greater than that of the semiconductor substrate 221.

In a solid-state imaging device having the configuration described above, punch-through is prevented by the punch-through stopper region 226 even when the impurity concentration in the p-type region below the gate electrode 225 is decreased as much as $1 \times 10^{16}$ to $1 \times 10^{15}$ cm$^{-3}$. Therefore, channel modulation by the gate voltage becomes more effective by decreasing the impurity concentration of the p-type region below the gate electrode 225, and the gate voltage can be lowered. In other words, a solid-state imaging device driven under low voltage can be realized.

SUMMARY OF THE INVENTION

In recent years, the size of a unit cell is reduced corresponding to demands for miniaturization and higher resolution of a solid-state imaging device, and a MOS transistor in the unit cells is further miniaturized as a consequence. For example, the cell size is decreased from the conventional 2.8 μm to 2.2 μm and the gate length is decreased from the conventional 0.85 μm to as long as 0.7 μm. In the conventional solid-state imaging device, when the cell size is miniaturized, the gate length of the gate electrode 225 is shortened and the distance between the signal accumulation region 222 and the drain region 224 is shortened. Accordingly, there is a problem that punch-through cannot be prevented by the punch-through stopper region 226 due to a short channel effect, and off-leakage current (indicated as A in FIG. 2) is generated so that an efficient amount of signal charge is not accumulated in the signal accumulation region 222. Hereafter, the generation of the off-leakage current is described in detail.

Figure 3A:
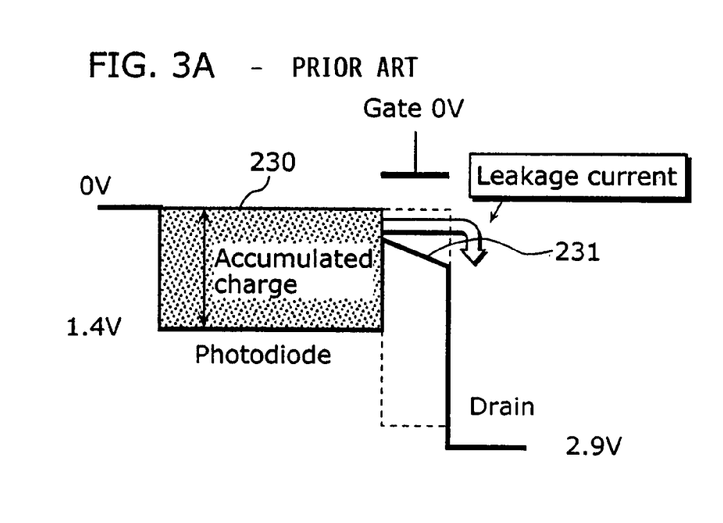
FIG. 3A is a diagram showing a potential distribution in a photodiode and the read-out transistor of the conventional MOS-type solid-state imaging device when the gate is off.
Figure 3B:
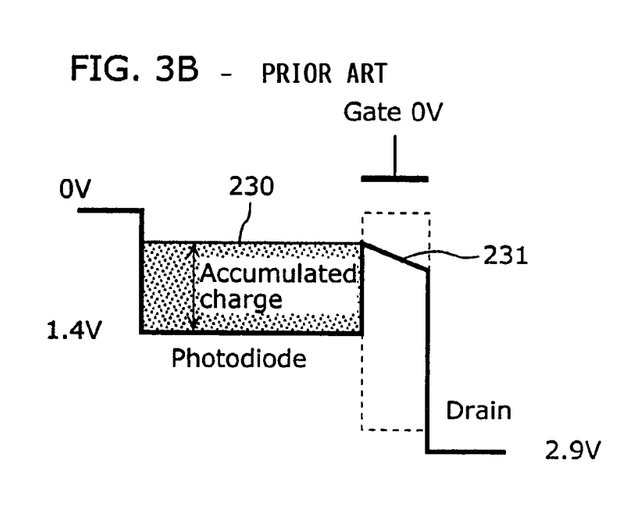

FIGS. 3A and 3B are diagrams each of which shows a potential distribution in the photodiode 211 and the read-out transistor 212 when the gate is off (when the gate voltage is 0V).

FIG. 3A shows that a potential under the gate becomes higher due to the short channel effect, and a potential 230 of the photodiode becomes lower than the potential 231 under the gate. Also, FIG. 3B shows that the signal charge of the photodiode transfers to the drain region as off-leakage current until the potential 230 of the photodiode becomes equal to the potential 231 under the gate.

Herein, as a method of reducing the off-leakage current, there is a method of increasing the impurity concentration of the semiconductor substrate 221. However, when the semiconductor substrate 221 has a high impurity concentration, the channel modulation by the gate voltage becomes less effective and the signal charge of the photodiode 211 cannot be transferred completely. In other words, as shown in the potential distribution in FIG. 4 (a potential distribution in a read-out path of signal charge), a potential gap 240 is generated between the photodiode and the gate electrode, leaving the signal charge in the photodiode, so that the signal charge in the photodiode cannot be transferred completely to the drain region. Accordingly, this method cannot solve the problem.

Considering the aforementioned problems, an object of the present invention is to provide a solid-state imaging device which can increase the amount of signal charge accumulation in the photodiode, and a manufacturing method thereof.

In order to achieve the aforementioned object, a solid-state imaging device according to the present invention is a solid-state imaging device including a gate electrode formed on a semiconductor substrate of a first conductive type. A signal accumulation region of a second conductive type, which accumulates signal charge obtained through a photoelectric conversion, is formed in the semiconductor substrate so that a portion of the signal accumulation region is positioned below the gate electrode. A drain region of the second conductive type is formed in the semiconductor substrate so that the drain region is positioned opposite the signal accumulation region across the gate electrode. A punch-through stopper region of the first conductive type has a higher impurity concentration than the semiconductor substrate, and is formed in the semiconductor substrate so that the punch-through stopper region is positioned under the drain region. An end of the punch-through stopper region on the side of the signal accumulation region is positioned closer to the signal accumulation region than an end of the drain region on the side of the signal accumulation region. Here, the end of the punch-through stopper region on the side of the signal accumulation region may be positioned below the gate electrode.

Figure 4:
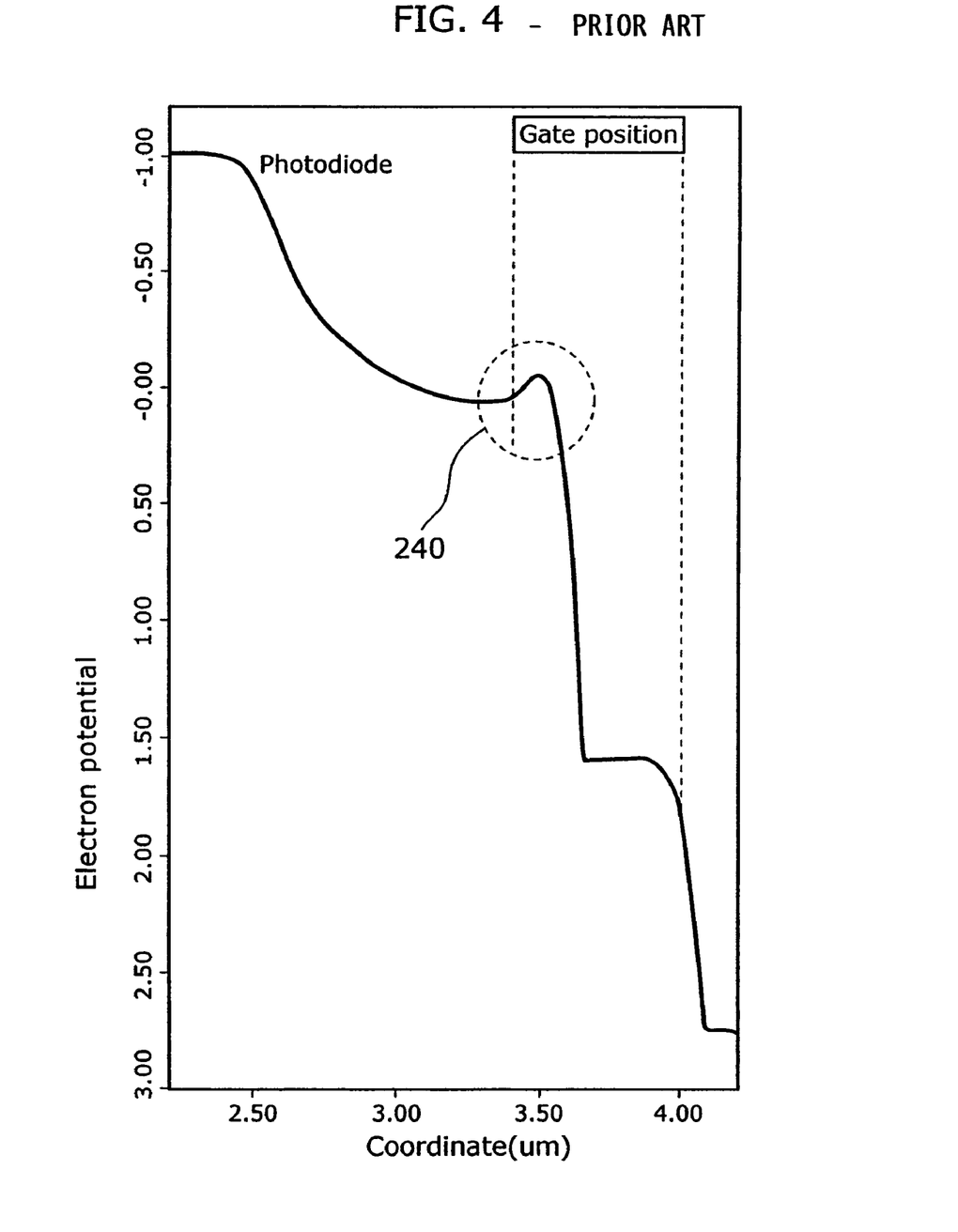
FIG. 4 is a diagram showing a potential distribution in the conventional solid-state imaging device when the gate is off (a potential distribution in a read-out path of signal charge)

Accordingly, the punch-through stopper region is positioned on a shortest path connecting between the signal accumulation region and the drain region. Therefore, the off-leakage current is reduced and the amount of signal charge accumulation in the photodiode can be increased. Also, the off-leakage current is reduced not by increasing the impurity concentration of the semiconductor substrate or a well, but by changing positions of the drain region and the punch-through stopper region. Therefore, a potential gap between the photodiode and the gate electrode as shown in FIG. 4 is not generated, so that the signal charge of the photodiode can be transferred completely to the drain region. In other words, a complete transfer of signal charge in the photodiode is achieved.

Also, the end of the drain region on the side of the signal accumulation region and the signal accumulation region may become progressively distant in a downward direction.

Consequently, the drain region is positioned distant from the signal accumulation region so that the short channel effect is lessened and punch-through is prevented. Therefore, the off-leakage current is reduced and the amount of signal charge accumulation in the photodiode can be more increased.

In addition, the solid-state imaging device further includes a read-out control region of the first conductive type which has an impurity concentration that is higher than the impurity concentration of the semiconductor substrate and is lower than the impurity concentration of the punch-through stopper region. It is formed in the semiconductor substrate so that a portion of the read-out control region is positioned below the gate electrode, wherein the drain region and the punch-through stopper region are formed within the read-out control region.

Accordingly, punch-through is mostly prevented by the punch-through stopper region so that a channel modulation with the gate voltage becomes more effective by decreasing the impurity concentration of the read-out control region and the gate voltage can be lowered. That is to say, a solid-state imaging device driven with low voltage can be realized.

Further, the present invention can be a manufacturing method of a solid-state imaging device including forming a gate electrode on a semiconductor substrate of a first conductive type, forming a drain region of a second conductive type in the semiconductor substrate by implanting an impurity of the second conductive type in a direction diagonal to a principal surface of the semiconductor substrate using the gate electrode as a mask and forming a punch-through stopper region of the first conductive type in the semiconductor substrate by implanting an impurity of the first conductive type in a direction vertical to the principal surface of the semiconductor substrate using the gate electrode as a mask.

Consequently, a manufacturing method of a solid-state imaging device which can increase the amount of signal charge accumulation in a photodiode can be realized.

According to the solid-state imaging device of the present invention, a solid-state imaging device capable of increasing the amount of signal charge accumulation in a photodiode can be realized. In addition, a solid-state imaging device capable of completely transferring the signal charge in the photodiode can be realized. Furthermore, a solid-state imaging device capable of being driven with low voltage can be realized.

Therefore, the present invention can provide a solid-state imaging device which can increase the amount of signal charge accumulation in the photodiode and a manufacturing method thereof. The practical value of the present invention is thus very high.

As further information about technical background to this application, the disclosure of Japanese Patent Application No. 2005-9678 filed on Jan. 17, 2005, including specification, drawings and claims, is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings:

FIG. 3B is a diagram showing a potential distribution in a photodiode and the read-out transistor of the conventional MOS-type solid-state imaging device when the gate is on;

DESCRIPTION OF THE PREFERRED EMBODIMENT

Hereafter, a solid-state imaging device according to an embodiment of the present invention is described with reference to the drawings.

Figure 5:
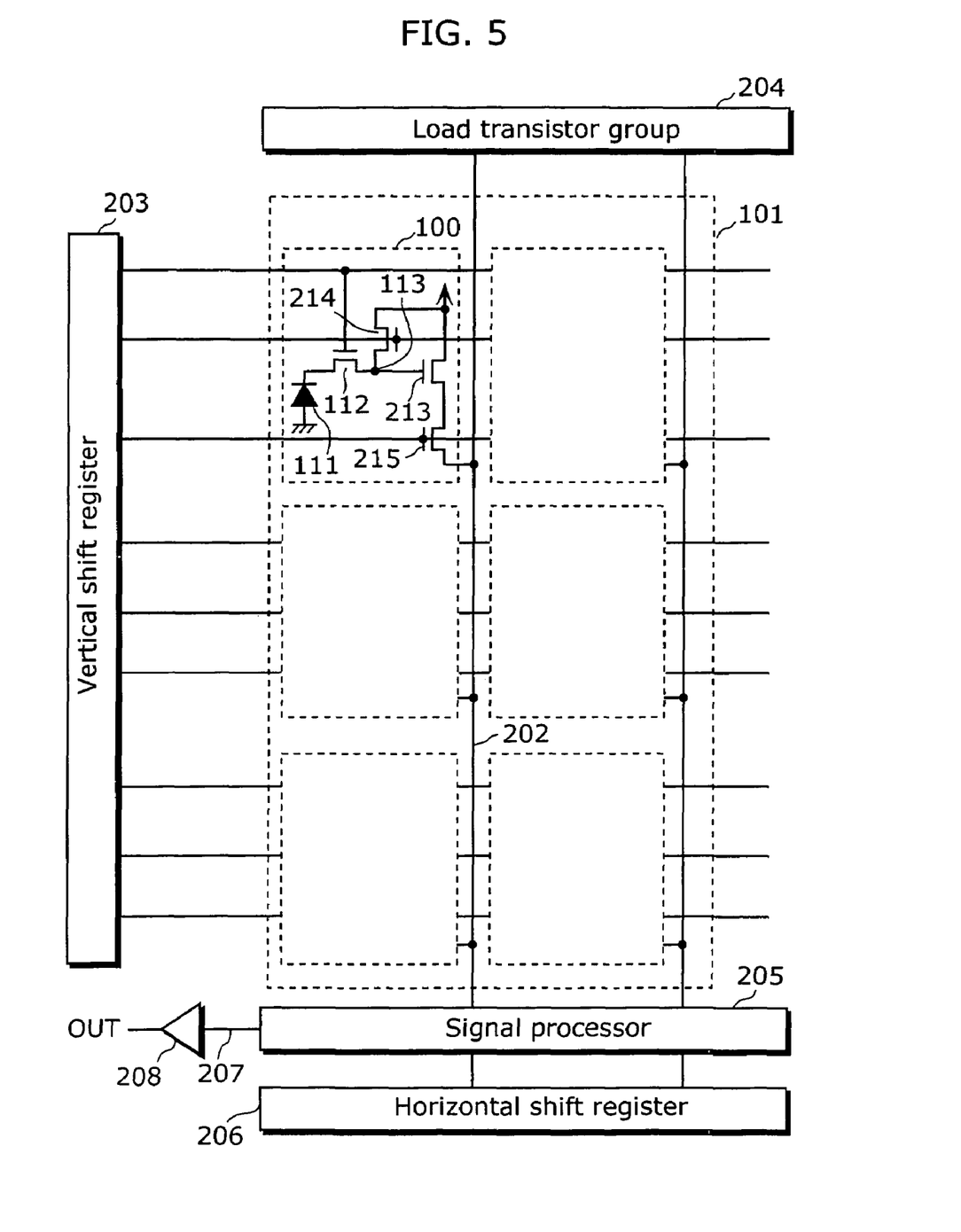
FIG. 5 is a circuit diagram showing a structure of a MOS-type solid-state imaging device in an embodiment of the present invention.

FIG. 5 is a circuit diagram showing a structure of a MOS-type solid-state imaging device according to the present embodiment. In FIG. 5, the same reference numbers are assigned to the same constituents as shown in FIG. 1, and detailed explanations about them are omitted here.

The MOS-type solid-state imaging device according to the present embodiment is made up of an image area 101 in which n×m unit cells 100 are two-dimensionally arranged, a first vertical signal line 202, a vertical shift register 203, a load transistor group 204, a signal processor 205, a horizontal shift register 206, a horizontal signal line 207, and an output amplifier 208.

Each of the unit cells 100 includes a photodiode 111 which converts an optical signal into signal charge, a read-out transistor 112 which reads out the signal of the photodiode 111, an amplifying transistor 213, a reset transistor 214, a vertical selecting transistor 215, and a FD unit 113 which detects signal voltage of the photodiode 111.

Figure 6:
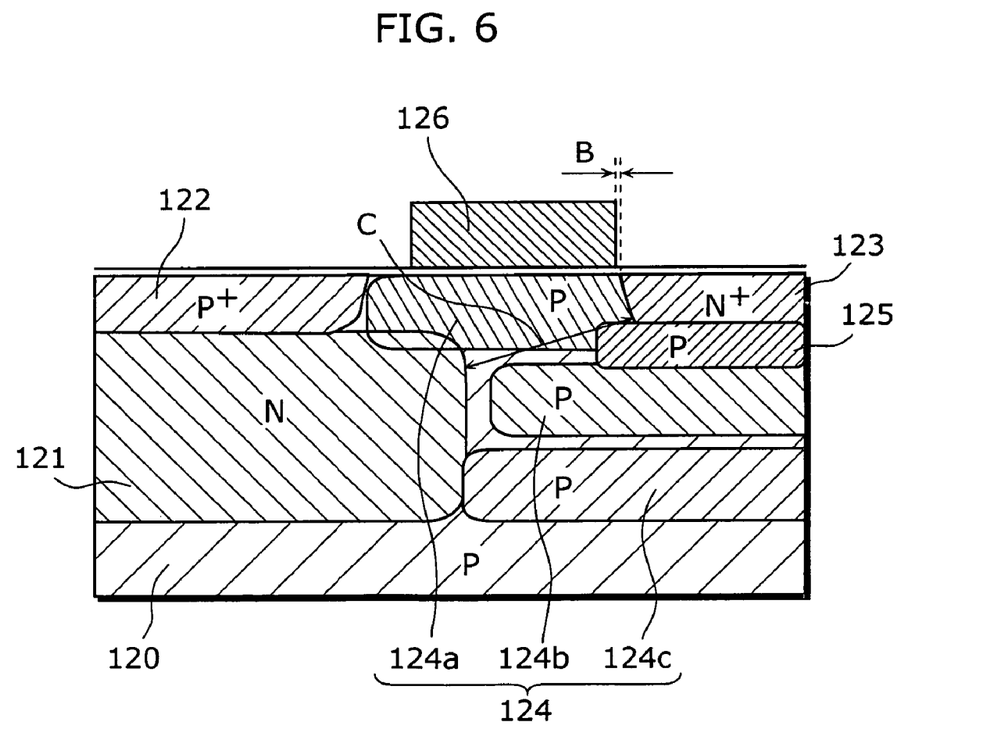
FIG. 6 is a cross-sectional diagram showing a structure of a unit cell of the MOS-type solid-state imaging device in the embodiment (a cross-section in the vicinity of the read-out transistor)

FIG. 6 is a cross-sectional diagram showing a structure of the unit cell 100 (a cross-section in the vicinity of the read-out transistor 112).

The unit cell 100 includes an n-type signal accumulation region 121 formed in a p-type semiconductor substrate 120, a p-type surface shielding region 122, a p-type read-out control region 124, an n-type drain region 123 and a p-type punch-through stopper region 125 formed in the read-out control region 124, and a gate electrode 126 of the read-out transistor 112 formed on the semiconductor substrate 120.

A portion of the signal accumulation region 121 is positioned below the gate electrode 126. The signal accumulation region 121 accumulates the signal charge obtained through a photo-electrical conversion, operating as the photodiode 111. Herein, the signal accumulation region 121 has an impurity concentration between $6.0 \times 10^{16}$ and $1.0 \times 10^{15}$ cm$^{-3}$.

The surface shielding region 122 is positioned above the signal accumulation region 121 and exposed to the surface of the semiconductor substrate 120 so that it shields noise charge generated in the surface of the semiconductor substrate 120, and prevents the noise charge from accumulating in the signal accumulation region 121. Herein, the surface shielding region 122 has an impurity concentration between $1.2 \times 10^{19}$ and $1.0 \times 10^{15}$ cm$^{-3}$.

The drain region 123 is positioned opposite the signal accumulation region 121 across the gate electrode 126 in the surface of the semiconductor substrate 120, and operates as the FD unit 113. Herein, the drain region 123 has an impurity concentration between $4.0 \times 10^{18}$ and $1.0 \times 10^{15}$ cm$^{-3}$.

Here, the drain region 123 is positioned to have a space B between the gate electrode 126 and the drain region 123, so that an end of the drain region 123 on the side of the signal accumulation region 121 is not positioned below the gate electrode 126. The space B is greater in a downward direction.

A portion of the read-out control region 124 is positioned below the gate electrode 126, and makes the potential change smooth from the signal accumulation region 121 to the drain region 123. The read-out control region 124 includes a p-type first read-out control region 124a, a p-type second control region 124b and a p-type third read-out control region 124c. The p-type first read-out control region 124a adjusts read-out voltage and deletes a first potential pocket formed between the signal accumulation region 121 and the drain region 123 in the case where the gate voltage is, for example, as low as 2.8 to 3.3 V. The p-type third read-out control region 124c is formed below the second read-out control region 124b, and deletes a second potential pocket formed closer to the side of the signal accumulation region 121 than the first potential pocket in the case where the gate voltage is low. The p-type second read-out control region 124b is formed below the first read-out control region 124a, and deletes a potential barrier formed between the first potential pocket and the second potential pocket. Herein, the read-out control region 124 has an impurity concentration that is higher than the semiconductor substrate 120 and lower than the punch-through stopper region 125. Specifically, the first read-out control region 124a has an impurity concentration between $1.0 \times 10^{17}$ and $1.8 \times 10^{16}$ cm$^{-3}$; the second read-out control region 124b has an impurity concentration between $2.6 \times 10^{16}$ and $3.2 \times 10^{15}$ cm$^{-3}$; and the third read-out control region 124c has an impurity concentration between $9.2 \times 10^{16}$ and $1.0 \times 10^{15}$ cm$^{-3}$.

Here, an end of the third read-out control region 124c on the side of the signal accumulation region 121 is positioned closer to the signal accumulation region 121 than a part below the end of the second read-out control region 124b on the side of the signal accumulation region 121. Further, the end of the second read-out control region 124b on the side of the signal accumulation region 121 is positioned closer to the drain region 123 than a part below the end of the first read-out control region 124a on the side of the signal accumulation region 121.

The first-out control region 124a occupies the surface of the semiconductor substrate 120 under the gate electrode 126. It can be seen from FIG. 6 that in fact the first read-out control region 124a occupies all of the surface of the semiconductor substrate that is under the gate electrode. The first read-out control region, further, as is clear from FIG. 6, is vertically positioned between the end of the signal accumulation region 121 and the gate electrode 126.

The punch-through stopper region 125 is positioned below the drain region 123 and prevents a punch-through. The end of the punch-through stopper region 125 on the side of the signal accumulation region 121 is positioned closer to the signal accumulation region 121 than the end of the drain region 123 on the side of the signal accumulation region 121, and the end of the punch-through stopper region 125 protrudes beyond a part below the end of the drain region 123. Further, a portion of the end of the protruded punch-through stopper region 125 is positioned below the gate electrode 126. Herein, the punch-through stopper region 125 has an impurity concentration between $1.6 \times 10^{17}$ and $1.0 \times 10^{16}$ cm$^{-3}$.

Here, in the case where the end of the punch-through stopper region 125 is greatly protruded beyond the part below the end of the drain region 123 and a large portion of the end of the punch-through stopper region 125 is positioned below the gate electrode 126, an impurity concentration of the read-out control region 124 becomes high so that a formation of a channel in the read-out control region 124 is prevented. Therefore, the length of the punch-through stopper region 125 protruded in a direction toward the gate electrode 126 is set to a length within which the channel formation is not prevented.

Next, a method of forming the photodiode 111, the read-out transistor 112, and the FD unit 113 in a process of manufacturing the MOS-type solid-state imaging device having the aforementioned structure is described along with cross-sectional diagrams shown in FIGS. 7A to 7H (a cross-section in the vicinity of the read-out transistor 112 of the unit cell 100). Note that the same reference numbers are assigned to the same constituents as shown in FIG. 6, and their detailed explanations are omitted here.

Figure 7A:
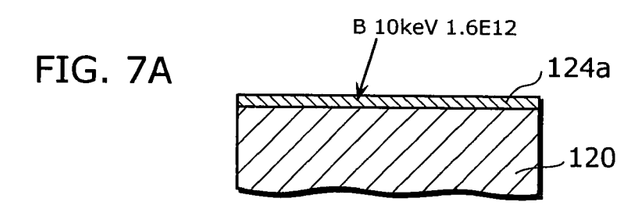
FIG. 7A is a cross-sectional diagram for explaining a method of forming a photodiode, read-out transistor and FD unit of the MOS-type solid-state imaging device in the embodiment (a cross-section in the vicinity of the read-out transistor of a unit cell)

First, as shown in FIG. 7A, the first read-out control region 124a is formed in the semiconductor substrate 120 by implanting p-type impurities using an ion implantation technique. The ion implantation is performed, for example, by implanting p-type impurities such as boron with a dose amount of $1.6 \times 10^{12}$ cm$^{-3}$ and with an implantation energy of around 10 keV.

Figure 7B:
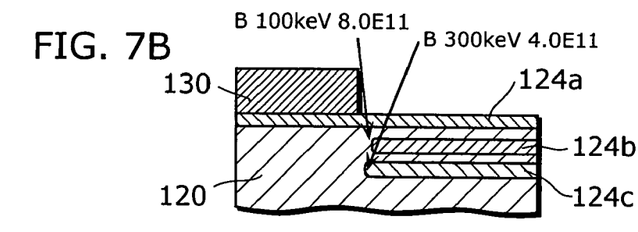
FIG. 7B is a cross-sectional diagram for explaining a method of forming a photodiode, read-out transistor and FD unit of the MOS-type solid-state imaging device in the embodiment (a cross-section in the vicinity of the read-out transistor of a unit cell)

Next, as shown in FIG. 7B, after forming patterns for forming the second read-out control region 124b and the third read-out control region 124c using photoresist 130, the second read-out control region 124b and the third read-out control region 124c are formed in the semiconductor substrate 120 by implanting p-type impurities using the ion implantation technique. The ion implantation for forming the second read-out control region 124b is performed, for example, by implanting p-type impurities such as boron with a dose amount of $8.0 \times 10^{11}$ cm$^{-3}$ and with an implantation energy of around 100 keV. The ion implantation for forming the third read-out control region 124c is performed, for example, by implanting the p-type impurities such as boron with a dose amount of $4.0 \times 10^{11}$ cm$^{-3}$ with an implantation energy of around 300 keV.

Here, an angle for implanting ions to a principle plane of the semiconductor substrate 120 differs for the ion implantation for forming the second read-out control region 124b and for the ion implantation for forming the third read-out control region 124c. Consequently, the ends of the second read-out control region 124b and the third read-out control region 124c are displaced and the step-shaped second read-out control region 124b and third read-out control region 124c are formed.

Figure 7C:
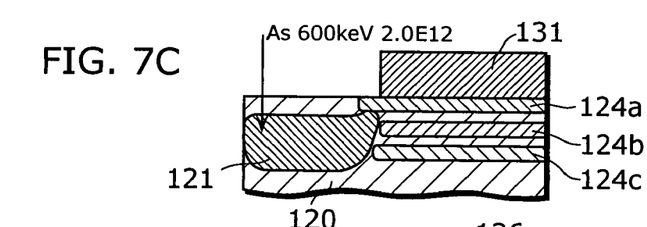
FIG. 7C is a cross-sectional diagram for explaining a method of forming a photodiode, read-out transistor and FD unit of the MOS-type solid-state imaging device in the embodiment (a cross-section in the vicinity of the read-out transistor of a unit cell)

Next, as shown in FIG. 7C, after forming a pattern for forming the signal accumulation region 121 using photoresist 131, the signal accumulation region 121 is formed in the semiconductor substrate 120 by implanting n-type impurities using the ion implantation technique. The ion implantation is performed, for example, by implanting n-type impurities such as arsenic with a dose amount of $2.0 \times 10^{12}$ cm$^{-3}$ and with an implantation energy of around 600 keV.

Figure 7D:
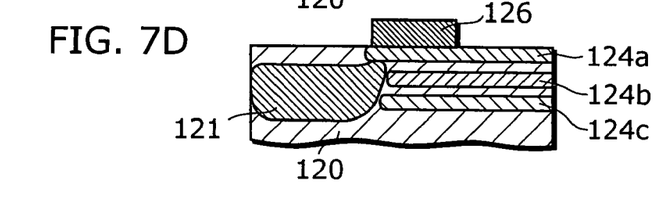
FIG. 7D is a cross-sectional diagram for explaining a method of forming a photodiode, read-out transistor and FD unit of the MOS-type solid-state imaging device in the embodiment (a cross-section in the vicinity of the read-out transistor of a unit cell)

After that, as shown in FIG. 7D, the gate electrode 126 is formed on the semiconductor substrate 120.

Figure 7E:
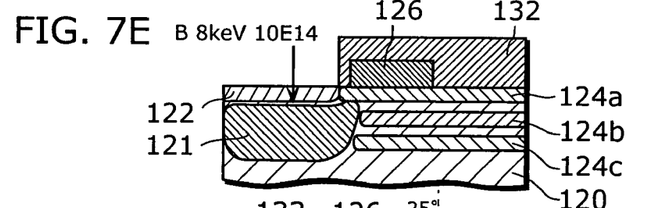
FIG. 7E is a cross-sectional diagram for explaining a method of forming a photodiode, read-out transistor and FD unit of the MOS-type solid-state imaging device in the embodiment (a cross-section in the vicinity of the read-out transistor of a unit cell)

Then, as shown in FIG. 7E, after forming a pattern for forming the surface shielding region 122 using the photoresist 132, the surface shielding region 122 is formed in the semiconductor substrate 120 by implanting p-type impurities using the ion implantation technique. The ion implantation is performed, for example, by implanting p-type impurities such as boron with a dose amount of $1.0 \times 10^{14}$ cm$^{-3}$ and with an implantation energy of around 8 keV.

Figures 7F, 7G:
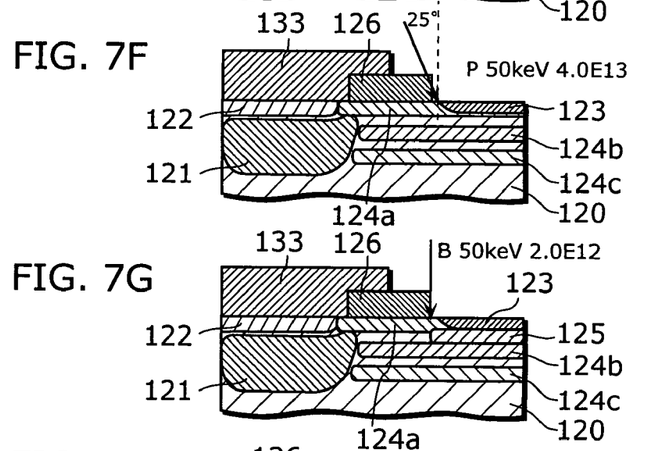
FIG. 7F is a cross-sectional diagram for explaining a method of forming a photodiode, read-out transistor and FD unit of the MOS-type solid-state imaging device in the embodiment (a cross-section in the vicinity of the read-out transistor of a unit cell)
FIG. 7G is a cross-sectional diagram for explaining a method of forming a photodiode, read-out transistor and FD unit of the MOS-type solid-state imaging device in the embodiment (a cross-section in the vicinity of the read-out transistor of a unit cell)

Following that, as shown in FIG. 7F, after forming a pattern for forming the drain region 123 using the photoresist 133, the drain region 123 is formed in the semiconductor substrate 120 by implanting n-type impurities using the ion implantation technique. The ion implantation is performed, for example, by implanting n-type impurities such as phosphorus with a dose amount of $4.0 \times 10^{13}$ cm$^{-3}$ and with an implantation energy of around 50 keV.

Here, a shadowing implantation that is an implantation with an angle of, for example, 25° against the gate electrode 126 using the gate electrode 126 as a mask is used for the implantation for forming the drain region 123.

Next, as shown in FIG. 7G, the punch-through stopper region 125 is formed in the semiconductor substrate 120 by implanting p-type impurities by the ion implantation technique using the photoresist 133 as a mask. The ion implantation is performed, for example, by implanting p-type impurities such as boron with a dose amount of $2.0 \times 10^{12}$ cm$^{-3}$ and with an implantation energy of around 50 keV.

Here, a self-aligned implantation that is an implantation vertical to the gate electrode 126 using the gate electrode 126 as a mask is used for the ion implantation for forming the punch-through stopper region 125.

Figure 7H:
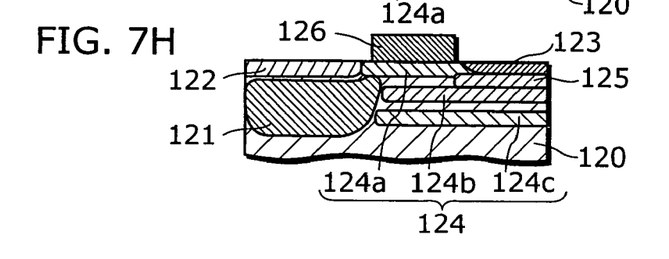
FIG. 7H is a cross-sectional diagram for explaining a method of forming a photodiode, read-out transistor and FD unit of the MOS-type solid-state imaging device in the embodiment (a cross-section in the vicinity of the read-out transistor of a unit cell)

Lastly, as shown in FIG. 7H, the photoresist 133 is removed, and the photodiode 111, the read-out transistor 112 and the FD unit 113 are formed.

As described in the above, in the MOS-type solid-state imaging device according to the present embodiment, an end of the punch-through stopper region 125 on the side of the signal accumulation region 121 protrudes beyond the part blow the end of the drain region 123. Therefore, the punch-through stopper region 125 is positioned on the shortest path (indicated as C in FIG. 6) connecting between the signal accumulation region 121 and the drain region 123. Consequently, the off-leakage current is reduced and the amount of signal charge accumulation in the photodiode can be increased. Further, punch-through is mostly prevented by the punch-through stopper region, so that an impurity concentration of the read-out control region is decreased; a channel modulation by the gate voltage becomes more effective; and the gate voltage can be lowered. That is to say, a solid-state imaging device which drives with low voltage can be realized.

Also, in the MOS-type solid-state imaging device according to the present embodiment, there is a space B between an end of the drain region 123 on the side of the signal accumulation region 121 and the gate electrode 126, and the space B is progressively distant in a downward direction. Therefore, the drain region 123 is positioned distant from the signal accumulation region 121 so that the influence of the short-channel effect is decreased and punch-through is prevented. Thus, the off-leakage current is reduced and the amount of signal charge accumulation in the photodiode can be further increased. For example, in the case where the minimum length between the drain region 123 and the signal accumulation region 121 is extended from 0.28 μm to 0.37 μm, the off-leakage current is reduced from $1.31 \times 10^{-14}$ A to $1.42 \times 10^{-16}$ A.

Figure 8:
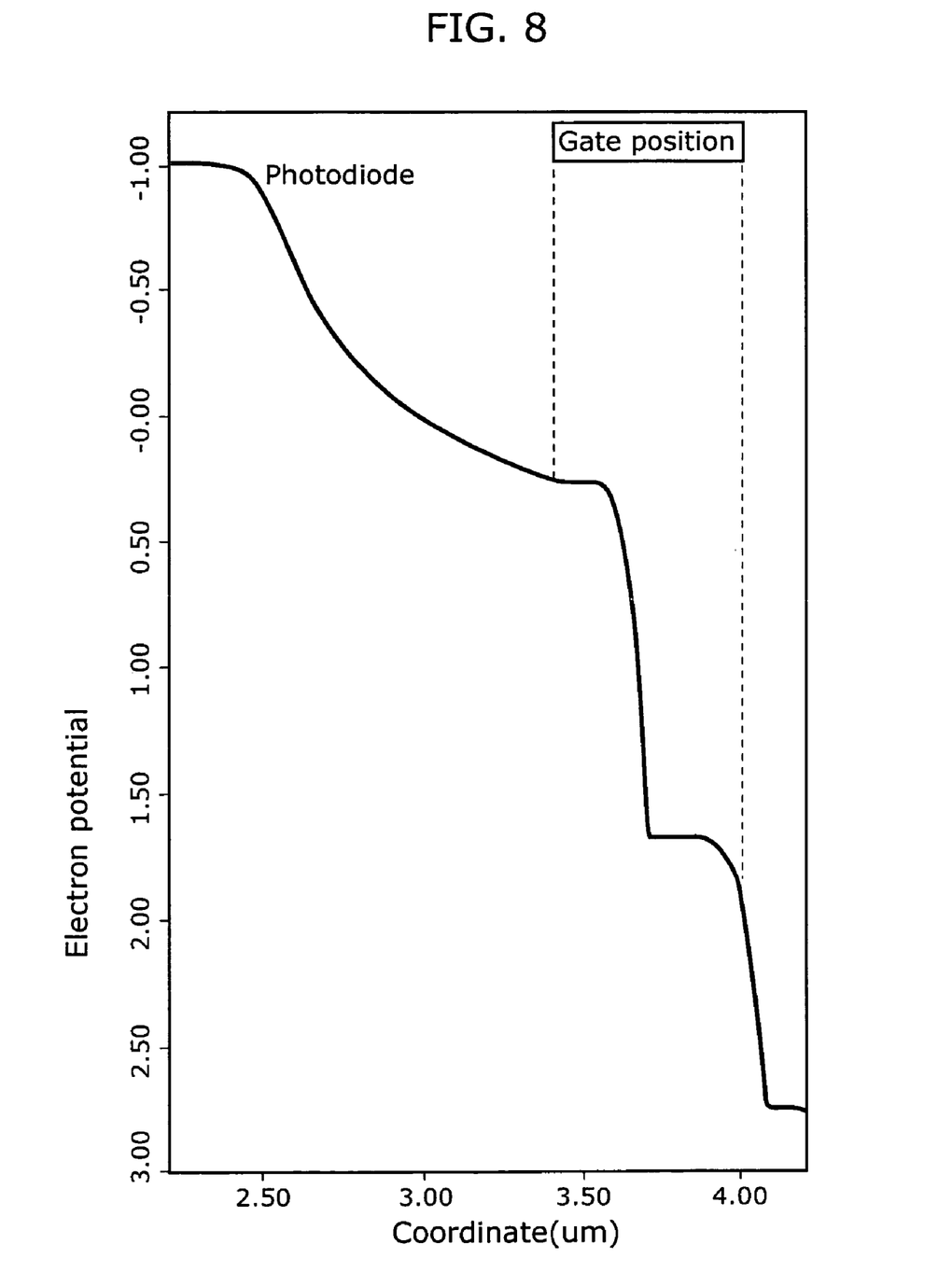
FIG. 8 is a diagram showing a potential distribution in the MOS-type solid-state imaging device according to the embodiment when the gate is on (a potential distribution in a read-out path of signal charge).

In addition, in the MOS-type solid-state imaging device according to the present embodiment, the off-leakage current is reduced not by increasing the impurity concentration of the semiconductor substrate 120, but by changing the positions of the drain region 123 and the punch-through stopper region 125. Consequently, a potential distribution (potential distribution in a read-out path of signal charge) as shown in FIG. 8 is formed when the gate is on. Therefore, the potential gap 240 as shown in FIG. 4 is not generated between the photodiode and the gate electrode so that the signal charge in the photodiode can be completely transferred to the drain region. In other words, a complete transfer of signal charge in the photodiode is achieved.

It should be noted that in the MOS-type solid-state imaging device according to the present embodiment, while the signal accumulation region 121, the surface shielding region 122 and the read-out control region 124 are formed in the semiconductor substrate 120, they can be formed in a well formed in a semiconductor substrate.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

The present invention is applicable to a solid-state imaging device, in particular to a small solid-state imaging device and the like mounted on a portable apparatus.

What is claimed is:

1. A solid-state imaging device comprising:
    a gate electrode formed on a semiconductor substrate having a semiconductor region of a first conductive type;
    a first read-out control region of the first conductive type formed below said gate electrode in said semiconductor substrate;
    a signal accumulation region of a second conductive type formed in said semiconductor substrate so that a portion of said signal accumulation region is positioned below said gate electrode;
    a drain region of the second conductive type formed in said semiconductor substrate so that said drain region is positioned opposite said signal accumulation region across said gate electrode; and
    a punch-through stopper region of the first conductive type having a higher impurity concentration than said semiconductor region and formed under said drain region in said semiconductor substrate,
    wherein an end of said punch-through stopper region on the side of said signal accumulation region is positioned closer to said signal accumulation region than is an end of said drain region on the side of said signal accumulation region, and
    said first read-out control region occupies all of a surface of said semiconductor substrate that is under said gate electrode.

2. The solid-state imaging device according to claim 1, wherein the end of said drain region on the side of said signal accumulation region and said signal accumulation region become progressively distant in a downward direction.

3. The solid-state imaging device according to claim 1, wherein the end of said punch-through stopper region on the side of said signal accumulation region is positioned below said gate electrode.

4. The solid-state imaging device according to claim 1, further comprising
    wherein said read-out control region has an impurity concentration that is higher than the impurity concentration of said semiconductor region and is lower than the impurity concentration of said punch-through stopper region.

5. The solid-state imaging device according to claim 1, wherein an end of said drain region on the side of said signal accumulation region is spaced from said gate electrode.

6. The solid-state imaging device according to claim 1, wherein said first read-out control region extends completely under said gate electrode so as to be vertically interposed between said signal accumulation region and said gate electrode.

7. The solid-state imaging device according to claim 6, and further comprising a second read-out control region below said first read-out control region and a third read-out control region below said second read-out control region, wherein each of said first, second and third read-out control regions have different impurity concentrations.

8. The solid-state imaging device according to claim 7, wherein an end of said third read-out control region on the side of said signal accumulation region is positioned closer to said signal accumulation region than is said second read-out control region.

9. The solid-state imaging device according to claim 7, wherein an end of said second read-out control region on the side of said signal accumulation region is positioned closer to said drain region than is an end of said first read-out control region on the side of said signal accumulation region.

10. A solid-state imaging device comprising:
    a gate electrode formed on a semiconductor substrate having a semiconductor region of a first conductive type;

a first read-out control region of the first conductive type formed below said gate electrode in said semiconductor substrate;

a signal accumulation region of a second conductive type formed in said semiconductor substrate so that a portion of said signal accumulation region is positioned below said gate electrode;

a drain region of the second conductive type formed in said semiconductor substrate so that said drain region is positioned opposite said signal accumulation region across said gate electrode; and a punch-through stopper region of the first conductive type having a higher impurity concentration than said semiconductor region and formed under said drain region in said semiconductor substrate, wherein an end of said punch-through stopper region on the side of said signal accumulation region is positioned closer to said signal accumulation region than is an end of said drain region on the side of said signal accumulation, and said first read-out control region vertically overlies said signal accumulation region so as to be vertically positioned between said gate electrode and said portion of said signal accumulation region positioned below said gate electrode.

* * * * *